(12) United States Patent
Jinguuji et al.

(10) Patent No.: US 9,269,540 B2
(45) Date of Patent: Feb. 23, 2016

(54) ION IMPLANTATION APPARATUS AND METHOD OF DETERMINING STATE OF ION IMPLANTATION APPARATUS

(71) Applicant: KABUSHIKI KAISHA TOSHIBA, Minato-ku (JP)

(72) Inventors: Masayuki Jinguuji, Oita (JP); Kei Hattori, Mie (JP); Keiji Fujita, Oita (JP); Takahito Nagamatsu, Oita (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 118 days.

(21) Appl. No.: 14/024,175

(22) Filed: Sep. 11, 2013

(65) Prior Publication Data

US 2014/0242732 A1    Aug. 28, 2014

(30) Foreign Application Priority Data

Feb. 26, 2013 (JP) ................. 2013-036260

(51) Int. Cl.
*H01J 37/317* (2006.01)
*H01J 37/30* (2006.01)
*H01J 37/02* (2006.01)

(52) U.S. Cl.
CPC ........... *H01J 37/3171* (2013.01); *H01J 37/026* (2013.01); *H01J 2237/24564* (2013.01); *H01J 2237/304* (2013.01)

(58) Field of Classification Search
CPC ......... H01J 37/02; H01J 37/24; H01J 37/243; H01J 37/30; H01J 37/3002; H01J 37/304; H01J 37/317; H01J 37/3171; H01J 37/3172
USPC .......................................... 250/492.2–492.3
See application file for complete search history.

(56) References Cited

U.S. PATENT DOCUMENTS

| | | | | |
|---|---|---|---|---|
| 4,786,814 A | * | 11/1988 | Kolondra et al. | 250/492.2 |
| 7,908,104 B2 | | 3/2011 | Tetsuka et al. | |
| 2002/0166980 A1 | * | 11/2002 | Niwayama et al. | 250/492.21 |
| 2005/0218344 A1 | * | 10/2005 | Starcher | 250/492.21 |
| 2007/0187615 A1 | * | 8/2007 | Low et al. | 250/397 |
| 2007/0200075 A1 | * | 8/2007 | Walther et al. | 250/492.21 |

FOREIGN PATENT DOCUMENTS

| | | | |
|---|---|---|---|
| JP | H04-143272 A | 5/1992 | |
| JP | 04-357657 A | 12/1992 | |

(Continued)

OTHER PUBLICATIONS

Japanese Office Action issued on Jun. 16, 2015 in corresponding Japanese Application No. 2013-036260, along with English translation thereof.

*Primary Examiner* — Michael Logie
*Assistant Examiner* — David E Smith
(74) *Attorney, Agent, or Firm* — White & Case LLP

(57) ABSTRACT

An ion implantation apparatus according to an embodiment includes an ion implantation unit, a position detection unit, a charge supply unit, a current value detection unit, and a determination unit. The ion implantation unit scans the surface of a substrate with an ion beam containing positively charged ions and implants the ions into the substrate. The position detection unit detects the scan position of the ion beam on the substrate. The charge supply unit generates a plasma, emits electrons contained in the plasma, and supplies the electrons to the substrate. The current value detection unit detects a current value that changes in accordance with the amount of electrons emitted by the charge supply unit. The determination unit determines the charge build-up state of the substrate based on a change in the current value, the change being accompanied by a change in the scan position.

10 Claims, 7 Drawing Sheets

(56) References Cited

FOREIGN PATENT DOCUMENTS

| JP | 04357657 | A | * | 12/1992 |
| JP | H10-012181 | A | | 1/1998 |
| JP | 2003-317655 | A | | 11/2003 |
| JP | 2004-327250 | A | | 11/2004 |
| JP | 2009-099496 | A | | 5/2009 |

* cited by examiner

_US 9,269,540 B2_

ION IMPLANTATION APPARATUS AND METHOD OF DETERMINING STATE OF ION IMPLANTATION APPARATUS

CROSS-REFERENCE TO RELATED APPLICATIONS

This application is based upon and claims the benefit of priority from Japanese Patent Application No. 2013-036260, filed on Feb. 26, 2013; the entire contents of which are incorporated herein by reference.

FIELD

An embodiment described herein relate generally to an ion implantation apparatus and a method of determining the state of an ion implantation apparatus.

BACKGROUND

There is conventionally an ion implantation apparatus that implants desired ions into a substrate of a semiconductor wafer on which a semiconductor apparatus is formed, and the like by irradiating the substrate with an ion beam. The ion implantation apparatus generally implants positively charged ions into the substrate. Hence, there may occur what is called charge-up where excessive positive charge is built up by the implanted ions on the surface of the substrate. Such charge-up of the substrate may become a cause of damage to a semiconductor device formed on the substrate.

Hence, there is an ion implantation apparatus that electrically neutralizes the positively charged surface of the substrate by generating a plasma by a plasma generation unit and supplying electrons in the plasma, together with ions, to the substrate.

However, the known ion implantation apparatus having the plasma generation unit has a problem that it is difficult to accurately determine whether or not electrons are being supplied normally from the plasma generation unit to the substrate.

DETAILED DESCRIPTION

According to an embodiment of the present invention, an ion implantation apparatus is provided. The ion implantation apparatus includes an ion implantation unit, a position detection unit, a charge supply unit, a current value detection unit, and a determination unit. The ion implantation unit scans the surface of a substrate with an ion beam containing first conductive ions and implants the ions into the substrate. The position detection unit detects the scan position of the ion beam on the substrate. The charge supply unit generates a plasma, emits second conductive charge contained in the plasma, and supplies it to the substrate. The current value detection unit detects a current value that changes in accordance with the amount of the charge emitted by the charge supply unit. The determination unit determines the charge build-up state of the substrate based on a change in the current value detected by the current value detection unit, the change being accompanied by a change in the scan position detected by the position detection unit.

An ion implantation apparatus and a method of determining the state of an ion implantation apparatus according to an embodiment is described below in detail with reference to the accompanying drawings. The present invention is not limited by the following embodiment.

Figure 1:
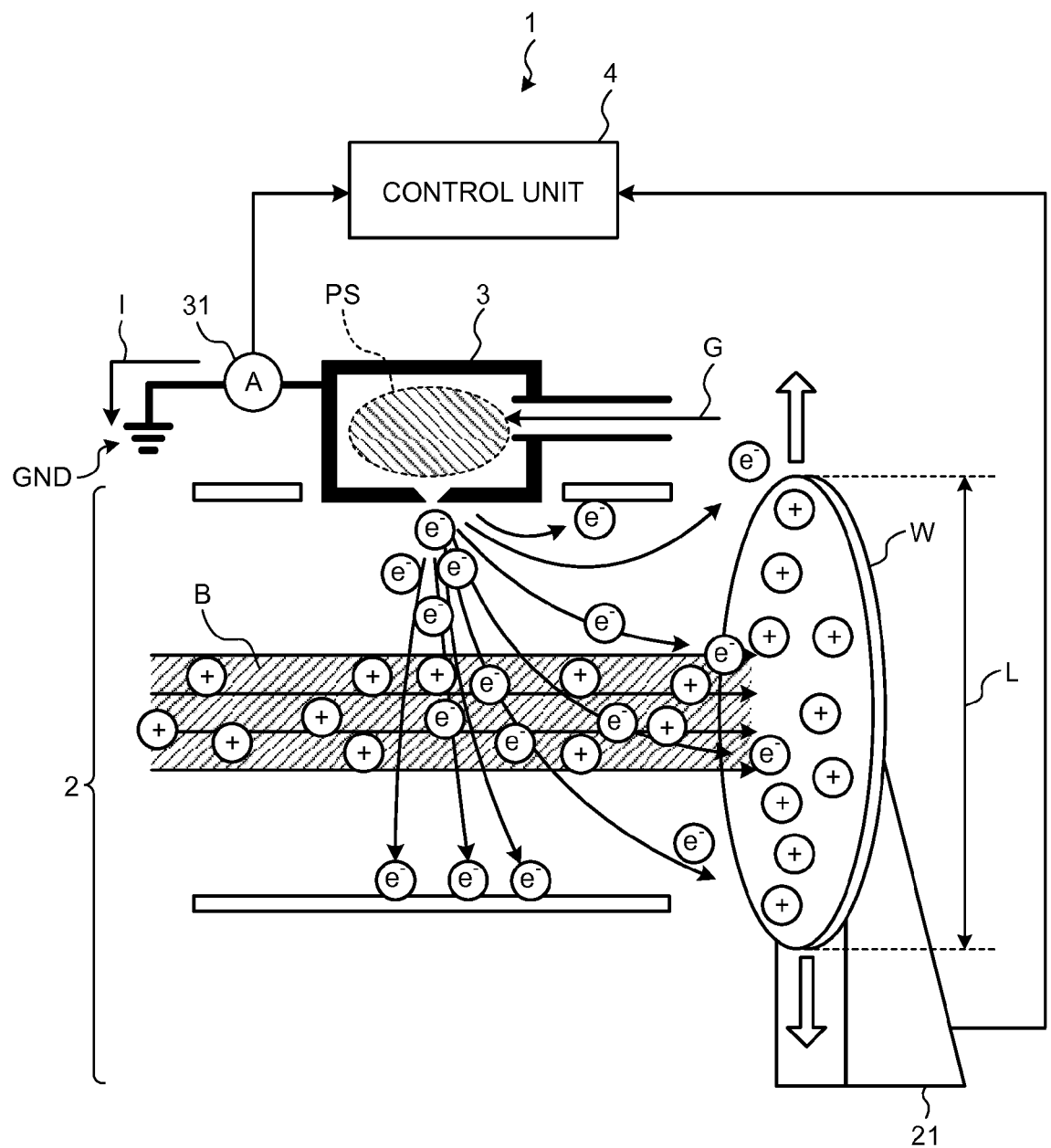
FIG. 1 is an explanatory view illustrating the operation of an ion implantation apparatus according to an embodiment.

FIG. 1 is an explanatory view illustrating the operation of an ion implantation apparatus 1 according to the embodiment. In the following, a description is given of a case where positively charged ions are implanted into a wafer W that is to be a substrate of a process target while electrons are supplied to the wafer W, but ions that are implanted into the wafer W may be negatively charged. In such a case, instead of electrons, the positive charge is supplied to the wafer W.

In FIG. 1, ions that are implanted into the wafer W are illustrated by "+," and electrons that are supplied to the wafer are illustrated by "e⁻." Moreover, FIG. 1 illustrates a part of the ion implantation apparatus 1. The entire configuration of the ion implantation apparatus 1 is described below with reference to FIGS. 2 to 4.

As illustrated in FIG. 1, the ion implantation apparatus 1 includes an ion implantation unit 2, a charge supply unit 3, and a control unit 4. The ion implantation unit 2 is a process unit that implants positively charged ions into the wafer W being a process target. A description is given here of a case where ions are implanted into the wafer W with diameter L by the ion implantation unit 2.

The ion implantation unit 2 moves the wafer W up and down (refer to outlined arrows in FIG. 1) by a wafer holding unit 21, for example, while directing an ion beam B containing ions that have been generated by an ion generation unit, which is described below, toward the wafer W. Consequently, the surface of the wafer W is scanned up and down in a reciprocating manner by the ion beam B, and ions are implanted into the entire surface of the wafer W.

The charge supply unit 3 is a process unit that emits electrons to an irradiation path of the ion beam B to supply the electrons to the surface of the wafer W during ion implantation. Consequently, in the ion implantation apparatus 1, it is possible to suppress damage to a semiconductor device already formed on the wafer W and a degradation of its characteristics due to excessive charge build-up, by electrically neutralizing the wafer W that becomes positively charged by implanting positively charged ions with electrons emitted from the charge supply unit 3.

The charge supply unit 3 generates a plasma PS using a material gas G introduced from the outside. Electrons contained in the plasma PS are attracted to the positive charge of the ions contained in the ion beam B and the positively charged wafer W, emitted to the irradiation path of the ion beam B, and supplied to the surface of the wafer W together with the ion beam B.

If the plasma PS is emitted, the flow of electrons is formed in a direction from a ground GND to an electron emission port through the charge supply unit 3. In short, electric current (hereinafter described as the "plasma emission current I") flows in a direction from the charge supply unit 3 to the ground GND. A current value detection unit 31 that detects the current value of the plasma emission current I is connected between the charge supply unit 3 and the ground GND.

The control unit 4 determines the charge build-up state of the wafer W based on the amount of a change in the current value detected by the current value detection unit 31, the change being accompanied by the scan position of the ion beam B on the wafer W being input from the wafer holding unit 21. Consequently, it is possible in the ion implantation apparatus 1 to accurately determine the charge build-up state of the wafer W.

Here, the current value of the plasma emission current I is a value that increases or decreases in proportion to the amount of electrons emitted from the charge supply unit 3. Hence, it is possible to roughly determine the charge build-up state of the wafer W, for example, by simply monitoring the current value of the plasma emission current I.

However, as illustrated in FIG. 1, all the electrons emitted from the charge supply unit 3 are not supplied to the wafer W, and a part of them is not supplied to the wafer W. Hence, it is difficult to accurately determine the charge build-up state of the wafer W by simply monitoring the current value of the plasma emission current I.

Accordingly, the control unit 4 accurately determines the charge build-up state of the wafer W based on the amount of a change in the current value of the plasma emission current I, the change being accompanied by a change in the scan position of the ion beam B on the wafer W. Specifically, for example, the irradiation area of the ion beam B on the wafer W is narrower if the edge position of the wafer W is scanned with the ion beam B than if the center position of the wafer W is scanned.

The accumulated amount of positive charge is less in the region where the irradiation area of the ion beam B on the wafer W is narrow than in the region where the irradiation area is wide. Hence, the amount of electrons extracted from the charge supply unit 3 by the positive charge accumulated on the surface of the wafer W is less if the edge position of the wafer W where the irradiation area is narrow is scanned with the ion beam B than if the center position of the wafer W where the irradiation area is wide is scanned.

In short, as the scan position of the ion beam B on the wafer W moves from the edge position toward the center, the current value of the plasma emission current I increases. As the scan position of the ion beam B on the wafer W moves from the center position toward the edge position afterward, the current value of the plasma emission current I decreases. Hence, it is possible to accurately judge that charge build-up on the wafer W is being neutralized normally if the current value of the plasma emission current I is increasing with the movement of the scan position of the ion beam B from the edge position toward the center position of the wafer W.

On the other hand, it is possible to accurately judge that charge build-up on the wafer W is not being neutralized normally and that the wafer W is still charged if the current value of the plasma emission current I is not increasing regardless of the fact that the scan position of the ion beam B is moving from the edge position toward the center position of the wafer W. Also in the case where the scan position of the ion beam B is moving from the center position toward the edge position of the wafer W, it is possible to accurately judge the charge build-up state of the wafer W from a similar logic.

Accordingly, the control unit 4 determines the charge build-up state of the wafer W based on the amount of a change in the current value detected by the current value detection unit 31, the change being accompanied by a change in the scan position of the ion beam B on the wafer W being input from the wafer holding unit 21. Consequently, it is possible in the ion implantation apparatus 1 to accurately determine the charge build-up state of the wafer W.

Figure 2:
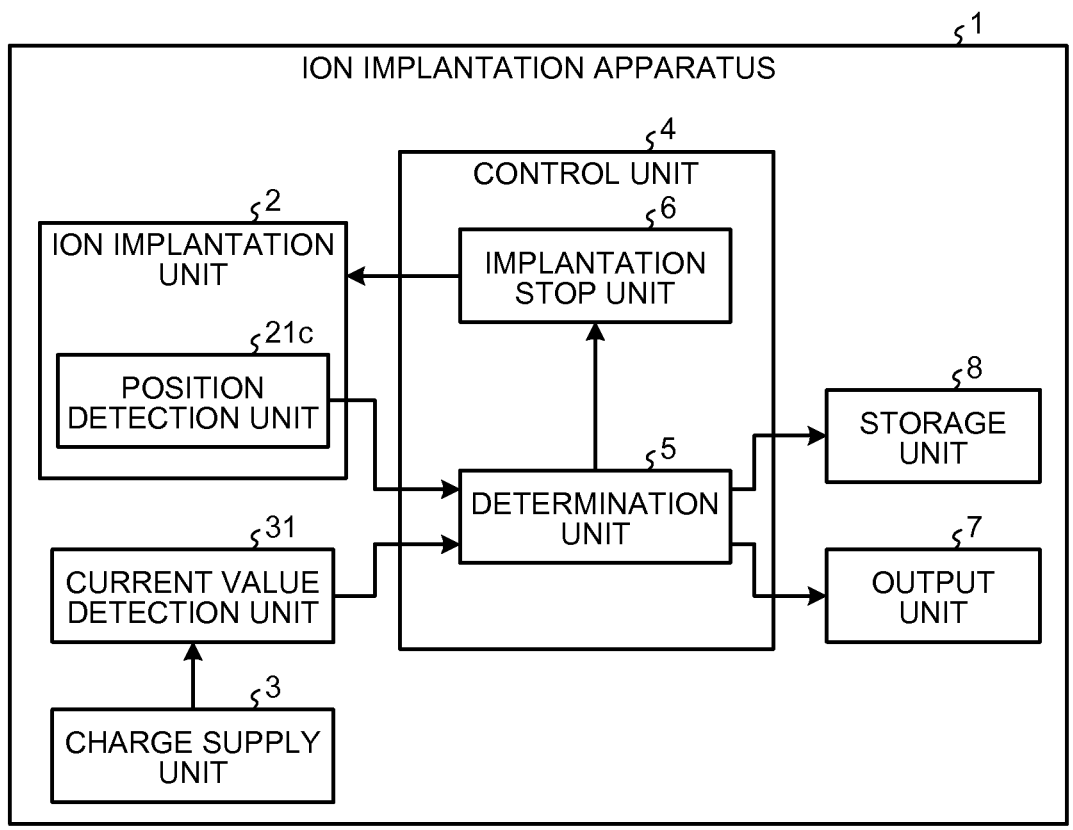
FIG. 2 is an explanatory view illustrating the entire configuration of the ion implantation apparatus according to the embodiment.

A specific example of the ion implantation apparatus 1 is described below in more detail with reference to FIGS. 2 to 8C. FIG. 2 is an explanatory view illustrating the entire configuration of the ion implantation apparatus 1 according to the embodiment. As illustrated in FIG. 2, the ion implantation apparatus 1 includes the ion implantation unit 2, the charge supply unit 3, the current value detection unit 31, the control unit 4, an output unit 7, and a storage unit 8.

The ion implantation unit 2 is, as described above, a process unit that implants ions into the surface of the wafer W, and includes a position detection unit 21c that detects the scan position of the ion beam B on the wafer W. Moreover, the charge supply unit 3 is a process unit that emits electrons to the irradiation path of the ion beam B, and is connected to the current value detection unit 31. The current value detection unit 31 outputs the detected current value of the plasma emission current I to the control unit 4.

Figure 3:
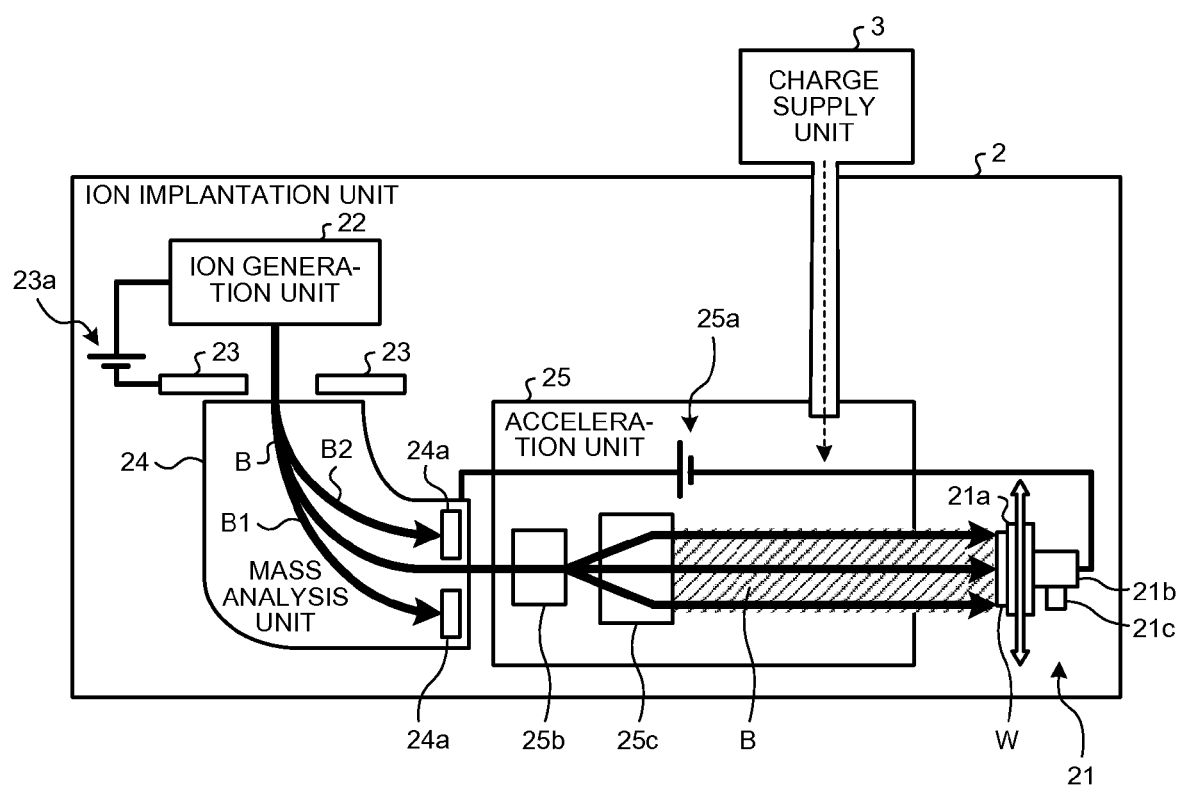
FIG. 3 is an explanatory view illustrating a configuration example of an ion implantation unit and a charge supply unit according to the embodiment.

An example of the configuration of the ion implantation unit 2 and the charge supply unit 3 is described with reference to FIG. 3. FIG. 3 is an explanatory view illustrating a configuration example of the ion implantation unit 2 and the charge supply unit 3 according to the embodiment. As illustrated in FIG. 3, the ion implantation unit 2 includes the wafer holding unit 21, an ion generation unit 22, an extraction electrode 23, a mass analysis unit 24, and an acceleration unit 25.

The ion generation unit 22 is a process unit that generates ions to be implanted into the wafer W. The ion generation unit 22 turns a predetermined source gas into a plasma to generate predetermined ions. The extraction electrode 23 is an electrode that extracts the desired ions generated by the ion generation unit 22 from the ion generation unit 22. The extraction electrode 23 is connected to a negative electrode of an extraction power supply 23a. Moreover, a positive electrode of the extraction power supply 23a is connected to the ion generation unit 22.

Consequently, the extraction electrode 23 can extract the positively charged desired ions from the ion generation unit 22. The ions extracted from the ion generation unit 22 are then formed into the ion beam B to enter the mass analysis unit 24.

The mass analysis unit 24 is a process unit that selectively passes ions with predetermined mass among ions contained in the ion beam B. The mass analysis unit 24 includes an analyzer magnet (illustration omitted) on both sides of a passage path of the ion beam B. Furthermore, the mass analysis unit 24 includes an analysis slit 24a at an emission unit for the ion beam B.

The analyzer magnet separates an ion beam B1 containing ions with larger mass than the desired ions and an ion beam B2 containing ions with smaller mass than the desired ions from the ion beam B by applying a magnetic force to the ion beam B.

The analysis slit 24a is a slit that blocks the ion beam B1 containing ions with larger mass than the desired ions and the ion beam B2 containing ions with smaller mass than the desired ions and selectively emits the ion beam B containing the desired ions from the mass analysis unit 24.

The acceleration unit 25 is a process unit that accelerates the ions of the ion beam B incident from the mass analysis unit 24 and imparts necessary energy for implantation into the wafer W to the ions. The acceleration unit 25 includes an accelerating power supply 25a, a focusing unit 25b, a scan unit 25c, and the like.

The accelerating power supply 25a is a power supply where a positive electrode is connected to the emission unit of the ion beam B of the mass analysis unit 24, and a negative electrode is connected to the wafer holding unit 21. A potential difference generated by the accelerating power supply 25a between the mass analysis unit 24 and the wafer holding unit 21 accelerates the ions of the ion beam B that pass through the acceleration unit 25 and imparts to the ions necessary energy for implantation into the wafer W.

The focusing unit 25b is a process unit that focuses the ion beam B incident from the mass analysis unit 24 by a condenser lens (e.g., a quadrupole lens) and emits it to the scan unit 25c. Moreover, the scan unit 25c is a process unit that parallelizes the ion beam B incident from the focusing unit 25b such that the ion beam B is irradiated vertically with respect to the wafer W.

The focusing unit 25b includes a scanner and a parallel lens. The scanner is an electrostatic plate that scans the ion beam B incident from the mass analysis unit 24 on the X-Y plane by an electrostatic force.

Moreover, the parallel lens is a dipole lens that parallelizes the ion beam B incident from the scanner by an electric field. The illustration is omitted here, but the acceleration unit 25 includes an energy filter that removes energy contamination from the ion beam B, and the like in the subsequent stage of the scan unit 25c.

The wafer holding unit 21 is a process unit that holds the wafer W being an ion-implantation target. The wafer holding unit 21 includes an adsorption holding unit 21a, a wafer transfer unit 21b, and a position detection unit 21c. The adsorption holding unit 21a is a chuck that adsorbs and holds the wafer W. The wafer transfer unit 21b transfers the adsorption holding unit 21a holding the wafer W, for example, up and down in a reciprocating manner in the diameter direction of the wafer W.

Moreover, the position detection unit 21c is a sensor that detects the scan position of the ion beam B on the wafer W, the scan position changing with the movement of the wafer transfer unit 21b. The position detection unit 21c outputs a signal indicating the detected scan position to the control unit 4. The wafer holding unit 21 is provided inside an unillustrated Faraday cup. The Faraday cup is a process unit that counts the number of ions implanted into the wafer W.

The charge supply unit 3 is a process unit, as described above, that generates a plasma and emits the electrons in the plasma to the irradiation path of the ion beam B. The charge supply unit 3 emits the electrons into the acceleration unit 25 of the ion implantation unit 2 that serves as the irradiation path of the ion beam B.

Returning to FIG. 2, the control unit 4 includes a determination unit 5 and an implantation stop unit 6. The determination unit 5 is a process unit that determines the charge build-up state of the wafer W based on the amount of a change in the current value detected by the current value detection unit 31, the amount changing with a change in the scan position detected by the position detection unit 21c.

The determination unit 5 determines whether or not the wafer W is charged by the ion implantation and outputs the determination result to the output unit 7. The output unit 7 is a notification device that displays the determination result by the determination unit 5, and outputs it by voice and the like for notification.

Moreover, the determination unit 5 determines the emission state indicating whether or not electrons are being emitted normally by the charge supply unit 3 based on the scan position detected by the position detection unit 21c and the current value detected by the current value detection unit 31. The determination unit 5 then outputs information indicating the determined emission state to the implantation stop unit 6.

Moreover, the determination unit 5 outputs to the storage unit 8 information where an irradiation area increasing/decreasing trend is associated with an emitted charge increasing/decreasing trend, information being generated when a determination is made on the emission state, and being described below. The storage unit 8 stores therein the information where the irradiation area increasing/decreasing trend is associated with the emitted charge increasing/decreasing trend, the information having been input from the determination unit 5.

The implantation stop unit 6 outputs a command that stops the operation of implanting ions to the ion implantation unit 2 when the determination unit 5 inputs thereto the emission state indicating that the charge supply unit 3 is not emitting electrons normally. Consequently, it is possible in the ion implantation apparatus 1 to prevent occurrence of a defective due to the continued ion implantation in a state where the charge supply unit 3 is not in normal operation.

Figure 4:
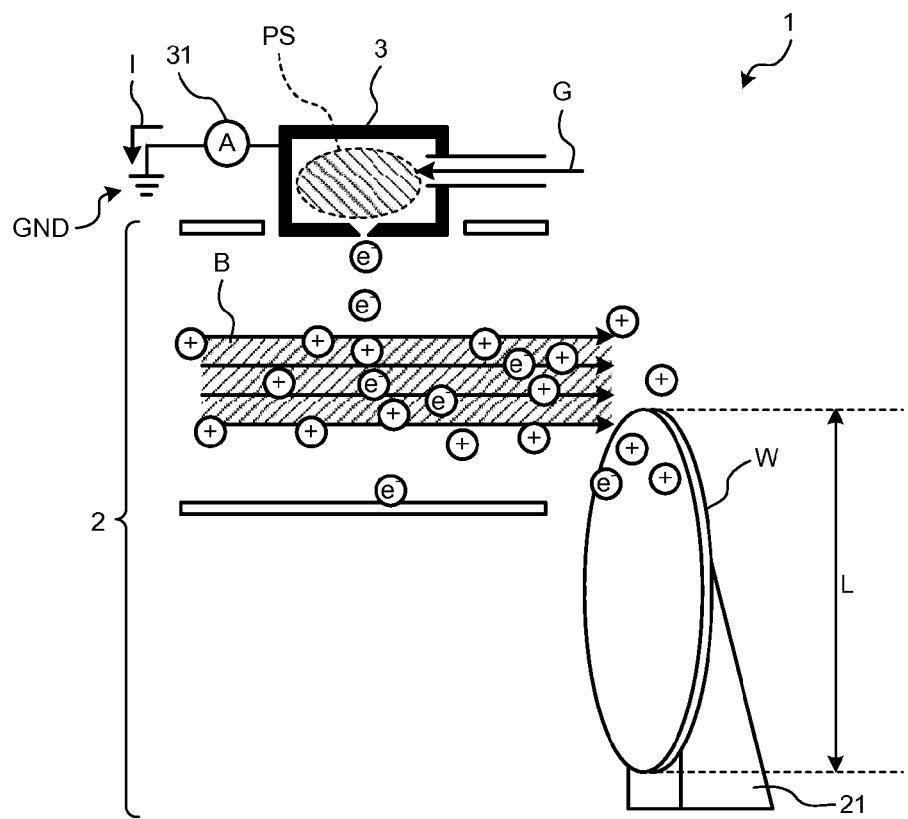
FIG. 4 is an explanatory view illustrating an example of the operation of the ion implantation apparatus according to the embodiment.
Figure 5:
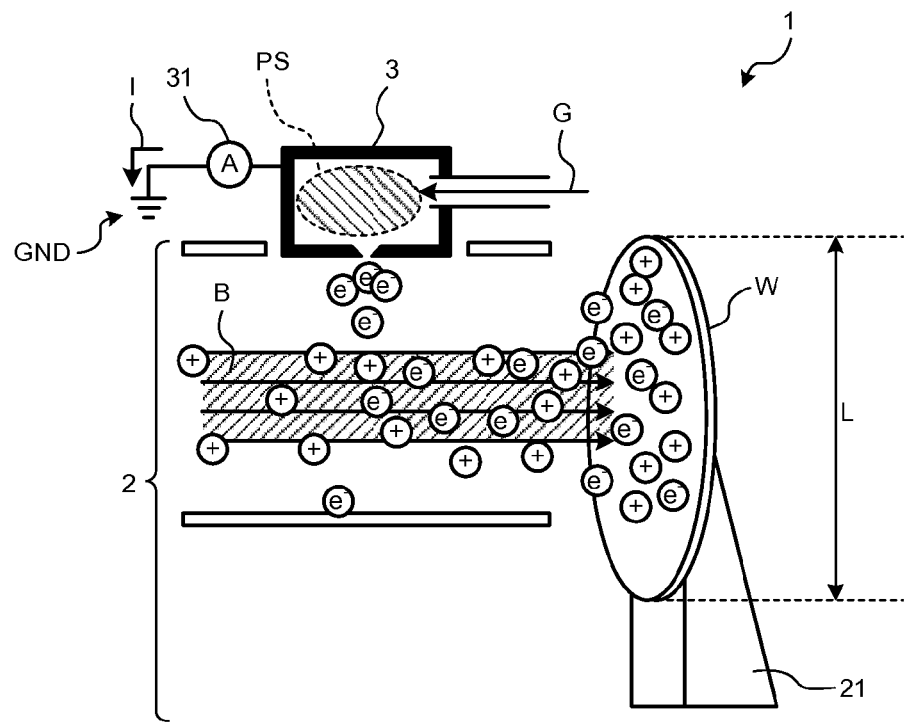
FIG. 5 is an explanatory view illustrating an example of the operation of the ion implantation apparatus according to the embodiment.
Figure 6:
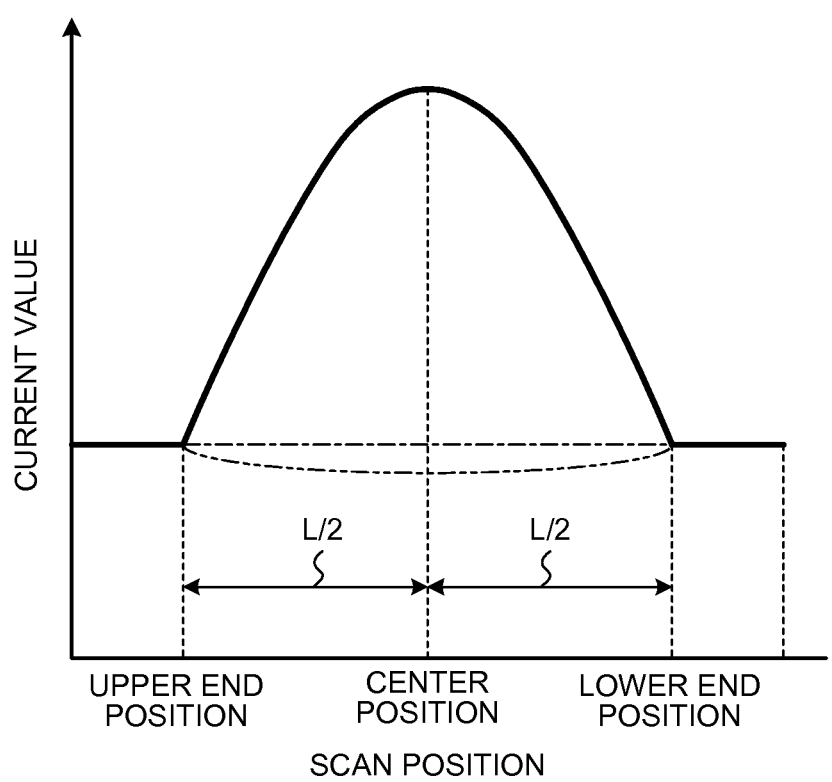
FIG. 6 is an explanatory view illustrating an example of a method of determining the states of a wafer and a charge supply unit by a determination unit according to the embodiment.

Examples of the operation of the ion implantation apparatus 1 and of a method of determining the states of the wafer W and the charge supply unit 3 by the determination unit 5 are described below with reference to FIGS. 4 to 6. FIGS. 4 and 5 are explanatory views illustrating an example of the operation of the ion implantation apparatus 1 according to the embodiment, and FIG. 6 is an explanatory view illustrating an example of the method of determining the states of the wafer W and the charge supply unit 3 by the determination unit 5 according to the embodiment.

FIGS. 4 and 5 illustrate a part of the ion implantation apparatus 1 illustrated in FIG. 1. The same reference numerals as those illustrated in FIG. 2 are assigned to the components illustrated in FIGS. 4 and 5, and their descriptions are omitted.

A description is given here assuming that the current value of the plasma emission current I increases or decreases due to a change in the charge build-up state of the wafer W, and does not increase or decrease due to any other factors than the charge build-up state of the wafer W. Moreover, a description is given below with reference to FIGS. 8A to 8C of the case where the current value of the plasma emission current I increases or decreases due to factors other than the charge build-up state of the wafer W in addition to a change in the charge build-up state of the wafer W.

As illustrated in FIG. 4, in the ion implantation apparatus 1, the irradiation of the ion beam B starts, for example, above an upper end of the wafer W, and the wafer W is moved by the wafer holding unit 21 to above an upper end of the ion beam B while the irradiation of the ion beam B is continued. While the wafer W is subsequently moved downward by the wafer holding unit 21, the irradiation of the ion beam B is continued.

The ion implantation apparatus 1 then implants ions into the entire surface of the wafer W by scanning the surface of the wafer W in a reciprocating manner with the ion beam B while repeating the up and down reciprocating movement of the wafer W. It is assumed here that, for example, the vertical length of the cross section of the ion beam B is shorter than the diameter L of the wafer W and the horizontal length (width) of the cross section is longer than the diameter L of the wafer W.

Moreover, the ion implantation apparatus 1 sequentially detects the scan position of the ion beam B on the wafer W in a predetermined cycle (e.g., at intervals of several msec) during a period of time while ions are being implanted into the wafer W. Moreover, the ion implantation apparatus 1 sequentially detects the current value of the plasma emission current I at timings in synchronization with timings to detect the scan position of the ion beam B during a period of time while ions are being implanted into the wafer W.

Here, as illustrated in FIG. 4, in the ion implantation apparatus 1, if the upper end position of the wafer W is being scanned with the ion beam B, the irradiation area of the ion beam B on the wafer W is relatively small. Accordingly, the amount of ions (positive charge) implanted into the wafer W is relatively small.

Hence, the amount of charge built up on the surface of the wafer W is small, and the amount of electrons extracted from the charge supply unit 3 by the ions (positive charge) on the surface of the wafer W is also small. Therefore, if the upper end position of the wafer W is being scanned with the ion beam B, as illustrated in FIG. 6, the current value of the plasma emission current I acquired by the ion implantation apparatus 1 is a relatively small value.

As illustrated in FIG. 5, in the ion implantation apparatus 1, if the wafer W is subsequently continued to be scanned with the ion beam B to the center position of the surface, the irradiation area of the ion beam B on the wafer W increases. Accordingly, the ions (positive charge) implanted into the wafer W also increase.

Consequently, the amount of charge built up on the surface of the wafer W also increases and accordingly the amount of electrons extracted from the charge supply unit 3 by the ions (positive charge) on the surface of the wafer W also increases. Therefore, as illustrated in FIG. 6, the current value of the plasma emission current I acquired by the ion implantation apparatus 1 increases gradually during a period of time while the wafer W is scanned with the ion beam B from the upper end position to the center position.

In the ion implantation apparatus 1, if the surface of the wafer W is subsequently continued to be scanned with the ion beam B from the center position to the lower end position, the irradiation area of the ion beam B on the wafer W decreases gradually. Therefore, as illustrated in FIG. 6, the current value of the plasma emission current I acquired by the ion implantation apparatus 1 decreases gradually during a period of time while the surface of the wafer W is scanned with the ion beam B from the center position to the lower end position.

The determination unit 5 then acquires information indicating the association relationship, as in FIG. 6, between the scan position of the ion beam B on the wafer W and the current value of the plasma emission current I. The information is information where an increasing/decreasing trend of the irradiation area of the ion beam B on the wafer W is associated with an increasing/decreasing trend of the current value of the plasma emission current I.

Here, as illustrated in FIG. 6, if the current value is in the increasing trend in a section where the scan position of the ion beam B is between the upper end position and the center position on the surface of the wafer W, in other words, in a section where the irradiation area of the ion beam B is in the increasing trend, electrons in accordance with the charge build-up state of the wafer W are being supplied. Moreover, if the current value is in the decreasing trend in a section where the irradiation area of the ion beam B is in the decreasing trend, electrons in accordance with the charge build-up state of the wafer W are being supplied.

In this manner, if the increasing/decreasing trend of the irradiation area of the ion beam B on the wafer W and the increasing/decreasing trend of the current value of the plasma emission current I are the same, the determination unit 5 determines that electrons are being emitted normally from the charge supply unit 3 and the charge build-up on the wafer W is being neutralized normally. The determination unit 5 then outputs the information indicating the state of the charge supply unit 3 to the implantation stop unit 6, and outputs the information indicating the charge build-up state of the wafer W to the output unit 7. Moreover, the determination unit 5 outputs and stores the information where the increasing/decreasing trend of the irradiation area is associated with the increasing/decreasing trend of the current value, the information being illustrated in FIG. 6, to and in the storage unit 8.

On the other hand, as illustrated by the alternate long and short dash line in FIG. 6, the current value may not change in the section where the scan position is between the upper end position and the center position and where the irradiation area is in the increasing trend, and in the section where the scan position is between the center position and the lower end position and where the irradiation area is in the decreasing trend. Moreover, as illustrated by the chain double dashed line in FIG. 6, the current value may be in the decreasing trend in the section where the scan position is between the upper end position and the center position and where the irradiation area is in the increasing trend, and the current value may be in the increasing trend in the section where the scan position is between the center position and the lower end position and where the irradiation area is in the decreasing trend. In such cases, the charge build-up on the wafer W is not neutralized normally.

Accordingly, the determination unit 5 determines that electrons are not being supplied normally from the charge supply unit 3 and the charge build-up on the wafer W is not being neutralized normally if the increasing/decreasing trend of the irradiation area contradicts the increasing/decreasing trend of the current value, as illustrated by the alternate long and short dash line and the chain double dashed line in FIG. 6. The determination unit 5 then outputs the information indicating the state of the charge supply unit 3 to the implantation stop unit 6 to stop the implantation of ions, and outputs the information indicating the charge build-up state of the wafer W to the output unit 7.

Figure 7:
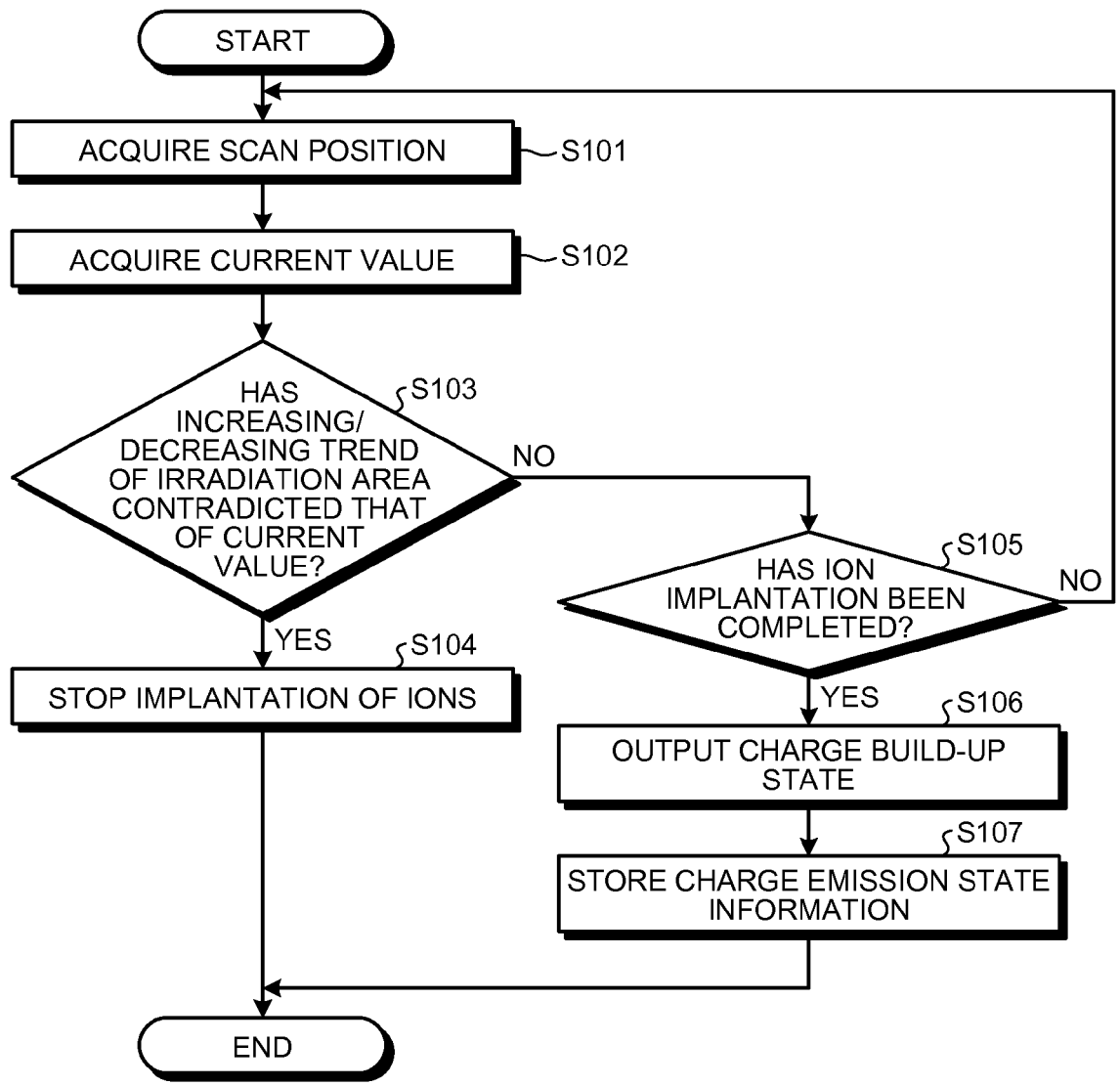
FIG. 7 is a flowchart illustrating processes to be executed by a control unit according to the embodiment.

Next, a description is given of processes to be executed by the control unit 4 according to the embodiment with reference to FIG. 7. FIG. 7 is a flowchart illustrating processes to be executed by the control unit 4 according to the embodiment. The control unit 4 executes the processes illustrated in FIG. 7 when ion implantation by the ion implantation unit 2 is started.

Specifically, as illustrated in FIG. 7, the control unit 4 acquires the scan position of the ion beam B on the wafer W from the position detection unit 21c (Step S101), and acquires the current value of the plasma emission current I from the current value detection unit 31 (Step S102). The control unit 4 subsequently determines whether or not the increasing/decreasing trend of the irradiation area decided from the irradiation position of the ion beam B contradicts the increasing/decreasing trend of the current value decided from the current value of the plasma emission current I (Step S103).

If determining that the increasing/decreasing trend of the irradiation area contradicts the increasing/decreasing trend of the current value (Step S103, Yes), the control unit 4 causes the ion implantation unit 2 to stop the implantation of ions (Step S104) and ends the processing. On the other hand, if determining that the increasing/decreasing trend of the irradiation area contradicts the increasing/decreasing trend of the current value (Step S103, No), the control unit 4 determines whether or not the ion implantation is complete (Step S105).

If determining that the ion implantation is not complete (Step S105, No), the control unit 4 moves the processing to Step S101. On the other hand, if determining that the ion implantation is complete (Step S105, Yes), the control unit 4 causes the output unit 7 to output the information indicating the charge build-up state of the wafer W (Step S106). The control unit 4 then causes the storage unit 8 to store therein the information where the increasing/decreasing trend of the irradiation area is associated with the increasing/decreasing trend of the current value as charge emission state information (Step S107), and ends the processing.

In the above embodiment, the description is given assuming that the current value of the plasma emission current I increases or decreases due to a change in the charge build-up state of the wafer W and does not increase or decrease due to any other factors. However, the current value of the plasma emission current I may increase or decrease due to other factors than the charge build-up state of the wafer W. A description is given here with reference to FIGS. 8A to 8C of a case where the current value of the plasma emission current I increases or decreases due to factors other than the charge build-up state of the wafer W in addition to a change in the charge build-up state of the wafer W.

Figure 8A:
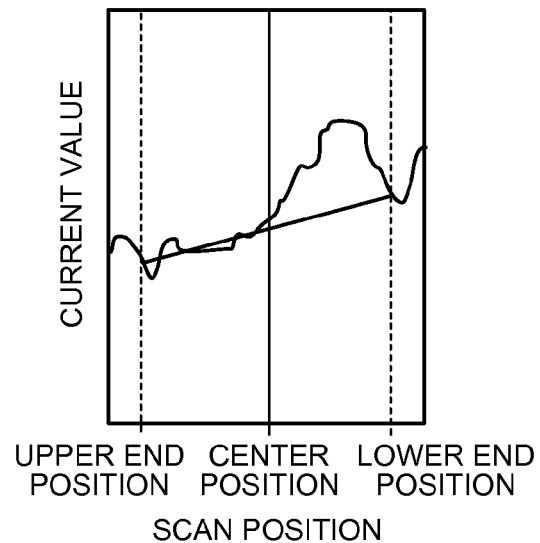
FIGS. 8A to 8C are explanatory views illustrating another example of the method of determining the states of the wafer and the charge supply unit by the determination unit according to the embodiment.
Figure 8B:
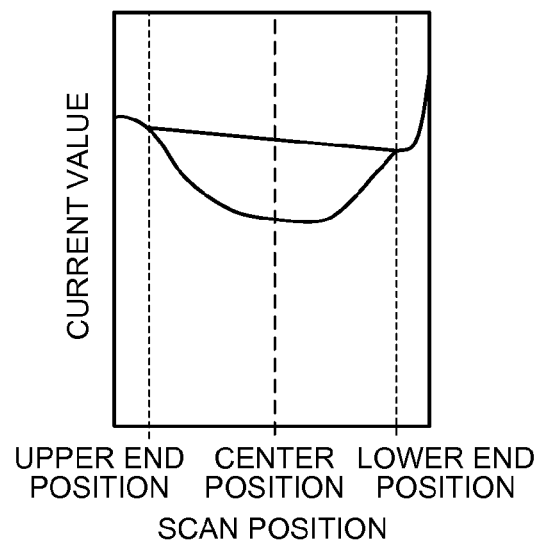
Figure 8C:
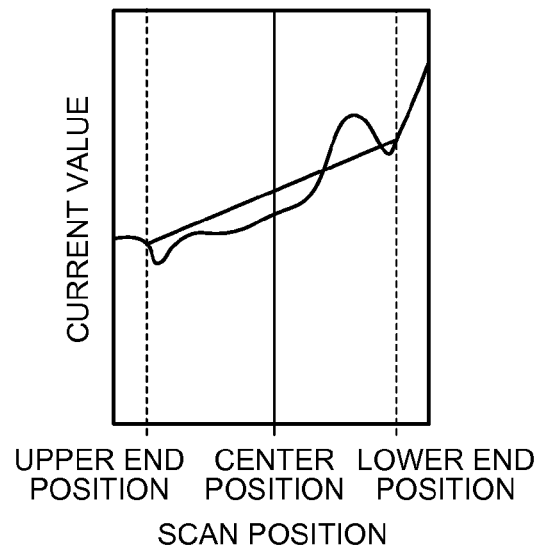

FIGS. 8A, 8B, and 8C are explanatory views illustrating another example of the method of determining the states of the wafer W and the charge supply unit 3 by the determination unit 5 according to the embodiment. In the ion implantation apparatus 1 illustrated in FIG. 1, for example, if the wafer W is moved upward, the wafer holding unit 21 may be irradiated with the ion beam B and may become charged.

In such a case, if the lower end of the wafer W is scanned with the ion beam B, electrons are extracted from the charge supply unit 3 also by the charge build-up on the wafer holding unit 21 in addition to electrons extracted from the charge supply unit 3 by the charge build-up on the wafer W. Hence, as illustrated in FIGS. 8A to 8C, the current value of the plasma emission current I becomes larger if the lower end of the wafer W is scanned than in the upper end is scanned.

Moreover, the current value of the plasma emission current I changes irregularly due to various external factors such as another component inside the ion implantation apparatus 1 and an environment around the wafer W in addition to the charge build-up on the wafer holding unit 21. Hence, the above-mentioned charge emission state information may not be on a substantially quadratic curve as in FIG. 6.

Accordingly, for example, if, as illustrated in FIG. 8A, acquiring the charge emission state information where changes in the current value accompanied by changes in the scan position are irregular, the determination unit 5 calculates a function linking a current value when the scan position is at the upper end and a current value when at the lower end (hereinafter described as the "reference straight line."). Furthermore, the determination unit 5 calculates the area of each region that is convex upward with respect to the reference straight line and the area of each region that is convex downward with respect to the reference straight line among the curves of the current value that changes irregularly.

The determination unit 5 then determines that electrons are being emitted normally from the charge supply unit 3 and the charge build-up on the wafer W is being neutralized normally if the calculated total area of the convex upward regions is larger than the total area of the convex downward regions. For example, if the charge emission state information illustrated in FIG. 8A is acquired, the total area of the convex regions is larger than the total area of the convex downward regions. Accordingly, it is determined that electrons are being emitted normally from the charge supply unit 3 and the charge build-up on the wafer W is being neutralized normally.

On the other hand, as illustrated in FIGS. 8B and 8C, if the total area of the convex regions is equal to or less than the total area of the convex downward regions, the determination unit 5 determines that electrons are not being emitted normally from the charge supply unit 3 and the charge build-up on the wafer W is not being neutralized normally. Consequently, it is possible to prevent a misjudgment on the electron emission state if the increasing/decreasing trend of the irradiation area does not contradict the increasing/decreasing trend of the current value in most of the scan section and actually electrons are being emitted normally, but the increasing/decreasing trends contradict each other in a part of the section due to some external factor.

As described above, the ion implantation apparatus according to the embodiment includes an ion implantation unit, a position detection unit, a charge supply unit, a current value detection unit, and a determination unit. The ion implantation unit scans the surface of a substrate with an ion beam containing first conductive ions and implants the ions into the substrate. The position detection unit detects the scan position of the ion beam on the substrate. The charge supply unit generates a plasma, emits second conductive charge contained in the plasma, and supplies it to the substrate. The current value detection unit detects a current value that changes in accordance with the amount of charge emitted by the charge supply unit.

The determination unit then determines the charge build-up state of the substrate based on a change in the current value detected by the current value detection unit, the change being accompanied by a change in the scan position detected by the position detection unit. Consequently, the ion implantation apparatus can accurately determine whether or not electrons are being supplied normally from the charge supply unit to the substrate.

Moreover, the determination unit determines the increasing/decreasing trend of the irradiation area of the ion beam on the substrate based on a change in the scan position, and determines the increasing/decreasing trend of charge emitted by the charge supply unit based on a change in the current value. The determination unit then determines the state of charge emission by the charge supply unit based on the increasing/decreasing trends of the irradiation area and the charge. Consequently, the ion implantation apparatus can accurately determine whether or not electrons are being emitted normally from the charge supply unit.

Moreover, the ion implantation apparatus further includes an implantation stop unit that stops the implantation of ions by the ion implantation unit if the increasing/decreasing trend of the irradiation area and the increasing/decreasing trend of the charge, which are determined by the determination unit, contradict each other. Consequently, the ion implantation apparatus can prevent damage to a semiconductor device already formed on the substrate and deterioration of its characteristics by excessive charge build up on the substrate due to the ion implantation into the substrate without supplying charge normally from the charge supply unit to the substrate.

Moreover, the ion implantation apparatus further includes a storage unit that stores therein information where the increasing/decreasing trends of the irradiation area and the charge are associated with each other, the trends being determined by the determination unit. Consequently, for example, a user of the ion implantation apparatus can estimate a time when the maintenance of the ion implantation apparatus is necessary by monitoring time-varying changes in the state of the ion implantation apparatus based on the information that is sequentially stored by the storage unit. Therefore, according to the ion implantation apparatus, it is possible to prevent an unexpected stop of the apparatus.

The timings to perform the above-mentioned determination processes, an output process of the determination result, and a storage process of the electron supply state information, which are performed by the determination unit 5, are examples. These various processes can be changed arbitrarily, for example, whenever one lot (25 wafers W) is processed, whenever each wafer W is processed, on every scan on the wafer W with the ion beam B, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ion implantation apparatus comprising:
   an ion implantation unit that scans in a reciprocating manner between one end and another end of a surface of a substrate with an ion beam containing first conductive ions and implants the ions into the substrate;
   a position detection unit that detects a scan position of the ion beam on the substrate;
   a charge supply unit that generates a plasma, emits second conductive charges contained in the plasma, and supplies the charges to the substrate;
   a current value detection unit that detects a current value changing in accordance with an amount of the charges emitted by the charge supply unit; and
   a determination unit that determines a charge build-up state of the substrate based on a change in the current value detected by the current value detection unit, the change being accompanied by a change in the scan position detected by the position detection unit, wherein
   the determination unit:
     calculates a reference straight line linking the current value detected when the scan position is located at the one end of the substrate and the current value detected when the scan position is located at the another end of the substrate; and
     determines whether the charges are normally discharged from the charge supply unit on the basis of a ratio between a total area of regions that are convex upward with respect to the reference straight line and a total area of regions that are convex downward with reference to the reference straight line, on a curve indicating changes in the current value accompanied by changes in the scan position.

2. The ion implantation apparatus according to claim 1, wherein the determination unit
   determines an increasing/decreasing trend of an irradiation area of the ion beam on the substrate based on a change in the scan position,
   determines an increasing/decreasing trend of charge emitted by the charge supply unit based on a change in the current value, and
   determines an emission state of the charge by the charge supply unit based on the increasing/decreasing trend of the irradiation area and the increasing/decreasing trend of the charge.

3. The ion implantation apparatus according to claim 2, further comprising an implantation stop unit that stops implantation of the ions by the ion implantation unit upon an increasing/decreasing trend of the irradiation area contradicting an increasing/decreasing trend of the charge, the increasing/decreasing trends being determined by the determination unit.

4. The ion implantation apparatus according to claim 2, further comprising a storage unit that stores therein information where an increasing/decreasing trend of the irradiation area is associated with an increasing/decreasing trend of the charge, the increasing/decreasing trends being determined by the determination unit.

5. The ion implantation apparatus according to claim 1, wherein
   the position detection unit detects the scan position in a predetermined cycle during scanning of the substrate with the ion beam, and
   the current value detection unit detects the current value at a timing in synchronization with a timing when the scan position is detected.

6. The ion implantation apparatus according to claim 1, further comprising an output unit that outputs the charge build-up state of the substrate by the determination unit.

7. The ion implantation apparatus according to claim 4, wherein the storage unit stores therein the information where the increasing/decreasing trend of the irradiation area is associated with the increasing/decreasing trend of the charge whenever a predetermined number of the substrates is scanned with the ion beam.

8. The ion implantation apparatus according to claim 1, wherein
   the determination unit determines that the charges are normally discharged from the charge supply unit when the total area of regions that are convex upward is larger than the total area of regions that are convex downward.

9. The ion implantation apparatus according to claim 1, wherein
   the determination unit determines that the charges are not normally discharged from the charge supply unit when the total area of regions that are convex upward is not more than the total area of regions that are convex downward.

10. The ion implantation apparatus according to claim 1, wherein
    the determination unit determines whether the charges are normally discharged from the charge supply unit on the basis of the ratio between the total area of regions that are convex upward and the total area of regions that are convex downward in a case where the current value detected when the scan position is located at the one end of the substrate is different from the current value detected when the scan position is located at the other end of the substrate.

* * * * *